United States Patent
Tahmassebpur et al.

(10) Patent No.: US 9,879,684 B2
(45) Date of Patent: Jan. 30, 2018

(54) APPARATUS AND METHOD FOR SHIELDING A CONTROLLED PRESSURE ENVIRONMENT

(71) Applicant: KLA-Tencor Corporation, Milpitas, CA (US)

(72) Inventors: Mohammed Tahmassebpur, San Ramon, CA (US); Salam Harb, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 579 days.

(21) Appl. No.: 14/023,169

(22) Filed: Sep. 10, 2013

(65) Prior Publication Data

US 2014/0072452 A1 Mar. 13, 2014

Related U.S. Application Data

(60) Provisional application No. 61/700,711, filed on Sep. 13, 2012.

(51) Int. Cl.
*C23C 14/35* (2006.01)
*F04D 19/04* (2006.01)
(Continued)

(52) U.S. Cl.
CPC ......... *F04D 19/042* (2013.01); *F04D 19/046* (2013.01); *F04D 27/0253* (2013.01);
(Continued)

(58) Field of Classification Search
CPC ........................... H01J 37/18; H01J 37/32513
See application file for complete search history.

(56) References Cited

U.S. PATENT DOCUMENTS 4,375,385 A * 3/1983 Halon ............... H01L 21/32136
204/192.32
4,446,702 A 5/1984 Peterson et al.
(Continued)

FOREIGN PATENT DOCUMENTS

EP 1107282 A2 6/2001
EP 1127954 A1 8/2001
(Continued)

*Primary Examiner* — Jason Berman
(74) *Attorney, Agent, or Firm* — Simpson & Simpson, PLLC

(57) ABSTRACT

An apparatus for shielding a controlled pressure environment, including a shield assembly with: a gate disc arranged for location in a chamber and including a first continuous surface facing an opening in the chamber and including an outer circumference extending past the opening in a radial direction orthogonal to a longitudinal axis passing through the chamber and the opening; and an at least one actuator arranged to displace the gate disc in an axial direction parallel to the longitudinal axis. The opening is arranged for connection to an inlet of a vacuum pump. In an example embodiment, the thermal system attains and maintains thermal equilibrium in the chamber and/or to shields the chamber from unwanted thermal affects by heating or cooling the gate disc to offset cooling or heat generated by the vacuum pump. For example, the gate disc is cooled to offset heat generated by a turbo-molecular pump.

18 Claims, 4 Drawing Sheets

(51) Int. Cl.
 *H01J 37/32* (2006.01)
 *H01J 37/18* (2006.01)
 *F04D 29/58* (2006.01)
 *F04D 29/60* (2006.01)
 *F04D 27/02* (2006.01)

(52) U.S. Cl.
 CPC ....... *F04D 29/5853* (2013.01); *F04D 29/601* (2013.01); *H01J 37/18* (2013.01); *H01J 37/3244* (2013.01); *H01J 37/32449* (2013.01); *H01J 37/32513* (2013.01)

(56) References Cited

U.S. PATENT DOCUMENTS

| | | | | |
|---|---|---|---|---|
| 5,007,981 | A | * | 4/1991 | Kawasaki ............... C23F 4/00 134/1.1 |
| 5,855,675 | A | * | 1/1999 | Doering ................ C23C 16/44 118/719 |
| 6,409,837 | B1 | * | 6/2002 | Hillman ............. C23C 16/4486 118/712 |
| 6,620,250 | B2 | | 9/2003 | Brezoczky et al. |
| 6,881,305 | B2 | | 4/2005 | Black et al. |
| 7,001,491 | B2 | | 2/2006 | Lombardi et al. |
| 7,318,869 | B2 | | 1/2008 | Chiang et al. |
| 2003/0077187 | A1 | | 4/2003 | Kabasawa et al. |
| 2011/0016890 | A1 | | 1/2011 | Kimura |
| 2013/0087286 | A1 | | 4/2013 | Carducci et al. |

FOREIGN PATENT DOCUMENTS

| | | |
|---|---|---|
| JP | 2005337071 | 12/2005 |
| JP | 2012102652 | 5/2012 |
| WO | 2011030966 A1 | 3/2011 |

* cited by examiner

APPARATUS AND METHOD FOR SHIELDING A CONTROLLED PRESSURE ENVIRONMENT

CROSS-REFERENCE TO RELATED APPLICATIONS

This application claims the benefit under 35 U.S.C. § 119(e) of U.S. Provisional Patent Application No. 61/700,711, filed Sep. 13, 2012, which application is incorporated herein by reference.

TECHNICAL FIELD

The present disclosure relates to an apparatus and method for shielding a controlled pressure environment, for example, shielding a process vacuum chamber from heat or contaminants generated by a vacuum pump. In particular, the present disclosure relates to a controllably displaceable disc for placement in a vacuum chamber. The apparatus and method can include thermal control of the disc and closed loop control of displacement of the disc based on measurement of a parameter in the chamber.

BACKGROUND

Vacuum pumps used to reduce pressure in a process chamber, for example, pumping purge or process gas out of the chamber, can introduce undesirable heat, cooling and/or contaminants into the chamber. It is known to use thermal shielding louvers in the inlet of cryogenic pumps to reduce the cooling effect of the pump on process chambers. Due to conductance loss (undesirable distortion and/or attenuation of flow patterns through the process chamber), thermal shields are not used at the inlet of turbo-molecular pumps (TMP). The effective pumping speed of a TMP is significantly reduced by the addition of baffles or louvered thermal shields at the inlet of the pump. Further, the desired symmetry for the flow of process gas being pumped out of the chamber by the TMP would be seriously compromised by the presence of such shields. Thus, for at least the preceding reasons, thermal shields have not been implemented on TMPs.

In general, adding louvers to the inlet of high vacuum pumps significantly reduces the conductance and effective pumping speed of the pump. Hence, to attain the same results as unlouvered pumps, more louvered pumps must be used. Increasing the number of pumps increases the cost of the system and the size of the vacuum process chamber considerably. For a pump with a conductance control valve at its inlet, thermal shielding causes significant and undesirable disturbance in the flow pattern of process gas. The symmetry of gas flow is extensively disturbed and altered by the thermal shield at the pump or valve inlet through which the flow must pass. However, flow symmetry is necessary to maintain uniform local gas pressure on the component which is being processed (such as a silicon wafer or a reticle in a semiconductor fabrication or inspection tool). Thus, implementing known thermal shielding at the pump inlet, sacrifices effective pumping speed and flow control, leading to much more complex and more expensive process chambers and vacuum systems.

It is known to measure temperature and/or pressure in a process chamber; however, sensors for executing the measurements are placed on the chamber walls interfering with flow through the chamber. Further, it is known to use pressure measurements in a process chamber to correlate pump operation to pump curves for the pump. Ideally the measurements would be proximate the pump inlet; however, known pressure sensors are located on the walls of the chamber, relatively far from the pump inlet.

SUMMARY

According to aspects illustrated herein, there is provided an apparatus for shielding a controlled pressure environment, including a shield assembly with: a gate disc arranged for location in a chamber and including a first continuous surface facing an opening in the chamber and including an outer circumference extending past the opening in a radial direction orthogonal to a longitudinal axis passing through the chamber and the opening; and at least one actuator arranged to displace the gate disc in an axial direction parallel to the longitudinal axis. The opening is arranged for connection to an inlet of a vacuum pump.

According to aspects illustrated herein, there is provided an apparatus for shielding a controlled pressure environment, including: a chamber with an opening and a longitudinal axis passing through the opening and centered within the opening; and a shield assembly including: a gate disc including a first continuous surface facing the opening and including an outer circumference, an entirety of the outer circumference extending past the opening in a radial direction orthogonal to the longitudinal axis; at least one actuator arranged to displace the gate disc in an axial direction parallel to the longitudinal axis; and a thermal system for controlling a temperature of at least a portion of the gate disc. The opening is arranged for connection to an inlet of a vacuum pump. The vacuum pump is arranged to create a flow through the chamber. At least a portion of the outer circumference is radially inward of the flow. In an example embodiment, the thermal system is used to attain and maintain thermal equilibrium in the chamber and/or to shield the chamber from unwanted thermal affects by heating or cooling the gate disc to offset cooling or heat generated by the vacuum pump. For example, the gate disc is cooled to offset heat generated by a turbo-molecular pump.

According to aspects illustrated herein, there is provided a method for shielding a controlled pressure environment, including: locating a gate disc within a chamber; facing a first continuous surface of the gate disc toward an opening in the chamber, to which an input of a vacuum pump is sealed; extending an outer circumference of the first continuous surface past the opening in a radial direction orthogonal to a longitudinal axis for the chamber passing through the opening; and displacing, using at least one actuator, the gate disc in an axial direction parallel to the longitudinal axis.

According to aspects illustrated herein, there is provided a method for shielding a controlled pressure environment, including: locating a gate disc within a chamber; facing a first continuous surface of the gate disc faces toward an opening in the chamber, to which a vacuum pump is sealed; extending an outer circumference of the first continuous surface past the opening in a radial direction orthogonal to a longitudinal axis for the chamber passing through the opening and centered within the opening; operating the vacuum pump to create a flow through the chamber at a first radial distance, orthogonal to the longitudinal axis, from the longitudinal axis; displacing the gate disc in an axial direction parallel to the longitudinal axis; and controlling, using a thermal system, a temperature of at least a portion of the gate disc. Extending the outer circumference of the first continuous surface past the opening in a radial direction includes locating at least a portion of the outer circumference at a second radial distance, orthogonal to the longitudinal axis, from the longitudinal axis. The second radial distance is less than the first radial distance. In an example embodiment, the method attains and maintains thermal equilibrium in the chamber and/or shields the chamber from unwanted thermal affects by heating or cooling the gate disc to offset cooling or heat generated by the vacuum pump. For example, the method cools the gate disc to offset heat generated by a turbo-molecular pump.

According to aspects illustrated herein, there is provided a method of removing impurities from a controlled pressure environment, including: locating a gate disc within a chamber so that a first continuous surface of the gate disc faces an opening, to which a vacuum pump is sealed, and extends past the opening in a radial direction orthogonal to a longitudinal axis for the chamber passing through the opening; operating the vacuum pump to create a flow through the chamber; absorbing, using a layer of getter material on the first continuous surface, an impurity; displacing, using at least one actuator, the gate disc in a first axial direction parallel to the longitudinal axis and toward the opening in the chamber; sealing at least a portion of the first continuous surface and the layer of getter material from the chamber; heating the layer of getter material; operating the vacuum pump to flow at least a portion of the impurity away from the gate disc; and displacing, using the at least one actuator, the gate disc in a second axial direction, opposite the first axial direction, to place the chamber in communication with the vacuum pump.

BRIEF DESCRIPTION OF THE DRAWINGS

Various embodiments are disclosed, by way of example only, with reference to the accompanying schematic drawings in which corresponding reference symbols indicate corresponding parts, in which.

DETAILED DESCRIPTION

At the outset, it should be appreciated that like drawing numbers on different drawing views identify identical, or functionally similar, structural elements of the disclosure. It is to be understood that the disclosure as claimed is not limited to the disclosed aspects.

Furthermore, it is understood that this disclosure is not limited to the particular methodology, materials and modifications described and as such may, of course, vary. It is also understood that the terminology used herein is for the purpose of describing particular aspects only, and is not intended to limit the scope of the present disclosure.

Unless defined otherwise, all technical and scientific terms used herein have the same meaning as commonly understood to one of ordinary skill in the art to which this disclosure belongs. It should be understood that any methods, devices or materials similar or equivalent to those described herein can be used in the practice or testing of the disclosure.

Figure 1:
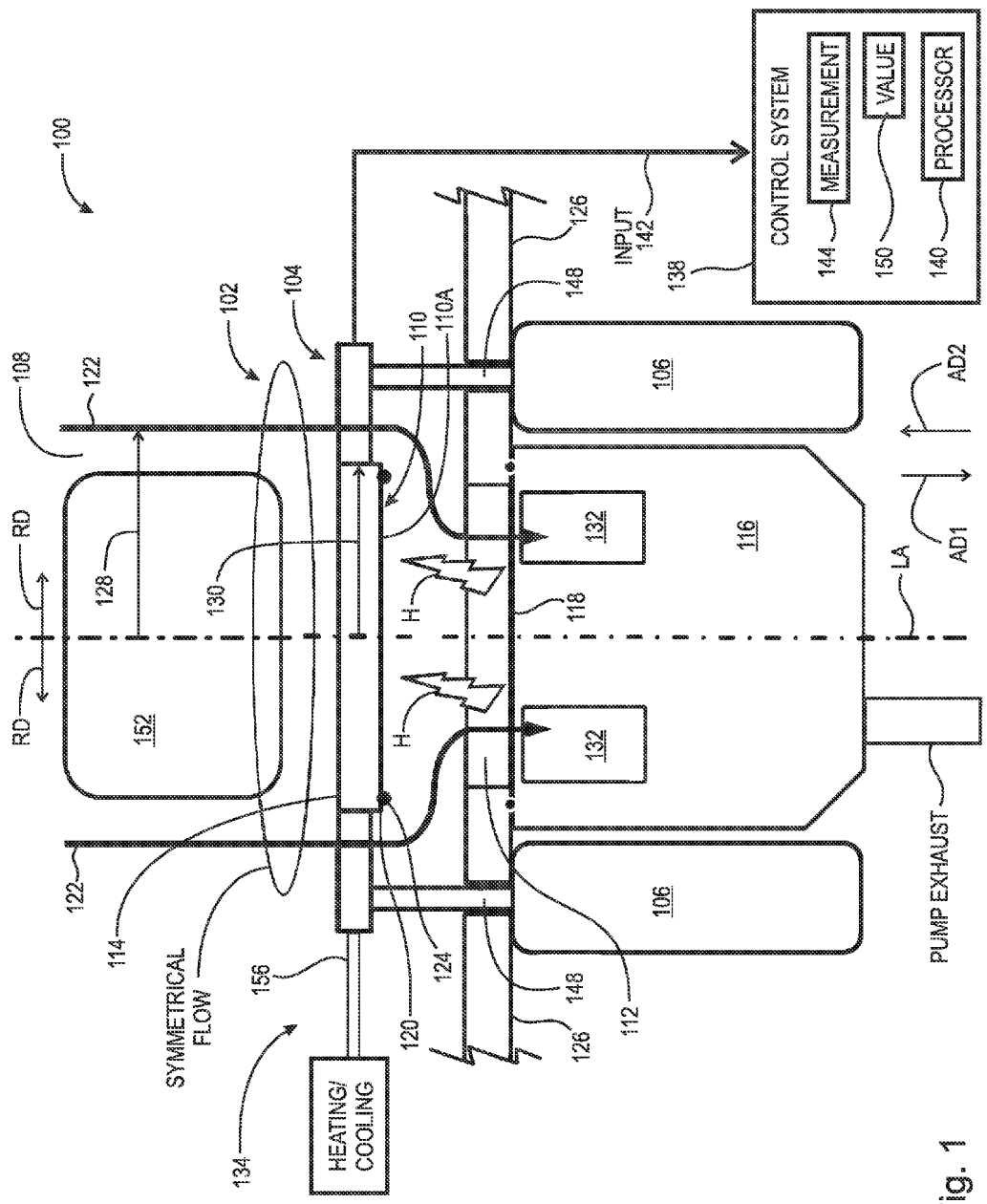
FIG. 1 is a schematic side view of an apparatus for shielding a controlled pressure environment, with a gate disc in an open position.

FIG. 1 is a schematic side view of apparatus 100 for shielding a controlled pressure environment, with a gate disc in an open position.

Figure 2:
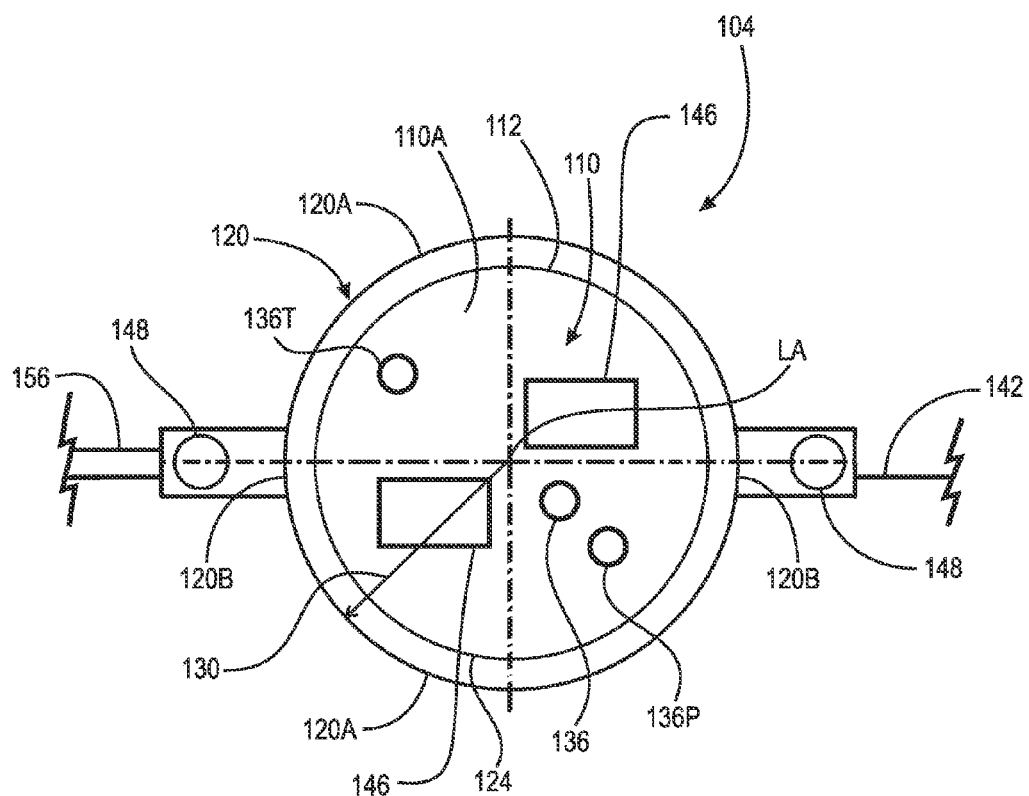
FIG. 2 is a schematic bottom view of the gate disc of FIG. 1.

FIG. 2 is a schematic bottom view of the gate disc of FIG. 1.

Figure 3:
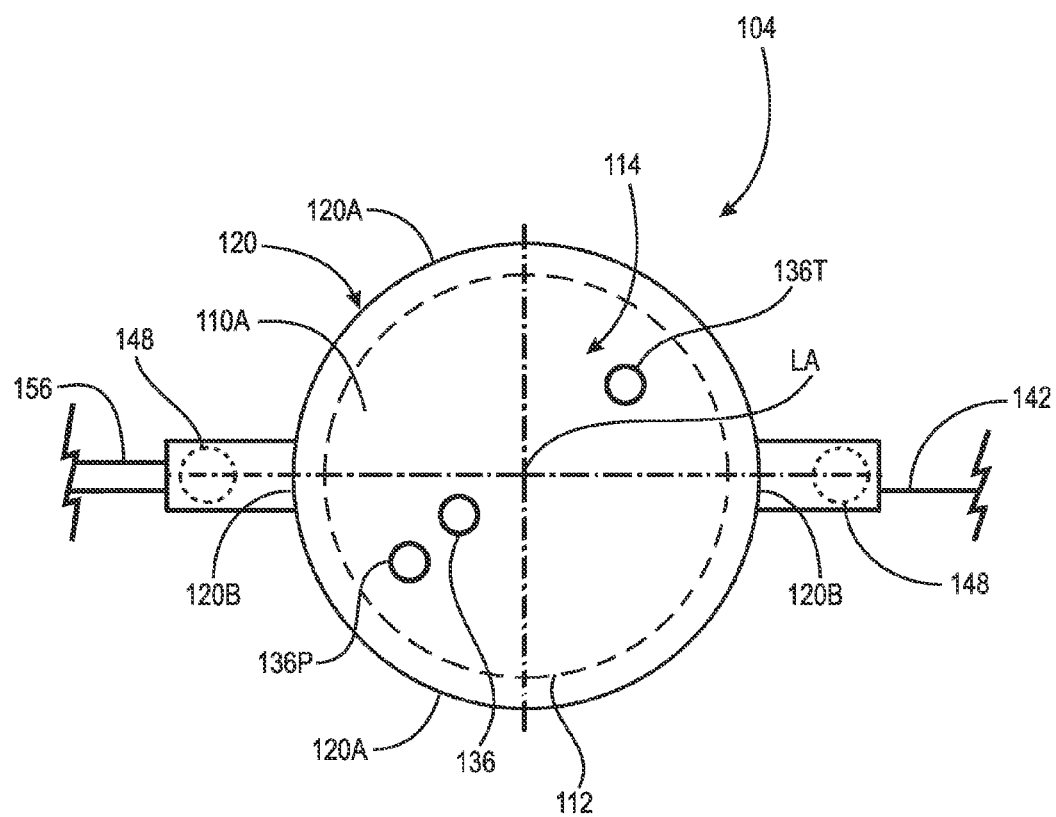
FIG. 3 is a schematic top view of the gate disc of FIG. 1.

FIG. 3 is a schematic top view of the gate disc of FIG. 1. The following should be viewed in light of FIGS. 1 through 3. Apparatus 100 includes shield assembly 102 with gate disc 104 and at least one actuator 106. Gate disc 104 is arranged to be installed in chamber 108. In an example embodiment, chamber 108 is a vacuum chamber. In an example embodiment, actuator(s) 106 is located outside of chamber 108. In an example embodiment, apparatus 100 includes chamber 108. Disc 104 includes continuous surface 110 facing opening 112 for chamber 108. By "continuous" surface, we mean that the surface is free of penetrations connecting surface 110 with opposite surface 114 of disk 104. Chamber 108 includes longitudinal axis LA passing through disc 104 and opening 112. In an example embodiment, axis LA is centered within opening 112. Chamber 108 is arranged for connection to vacuum pump 116. For example, inlet 118 of the pump is arranged to be sealed to opening 112 so that the inlet is in communication with the opening. Pump 116 can be any pump known in the art, for example, a turbo-molecular pump or a cryogenic pump.

Disc 104, in particular, outer circumference 120 of surface 110, extends past opening 112 in radial direction RD, orthogonal to axis LA. Actuator 106 is arranged to displace disc 104 in axial directions AD1 and AD2, parallel to axis LA. Disc 104 can be displaced in directions AD1 and AD2 to control a rate of flow for flow path 122 for a gas, such as a purge gas or process gas, in chamber 108. For example, displacing the disc in direction AD2 enables an increase in the rate and displacing the disc in direction AD1 decreases the rate. Actuator(s) 106 can be any actuator known in the art.

Figure 4:
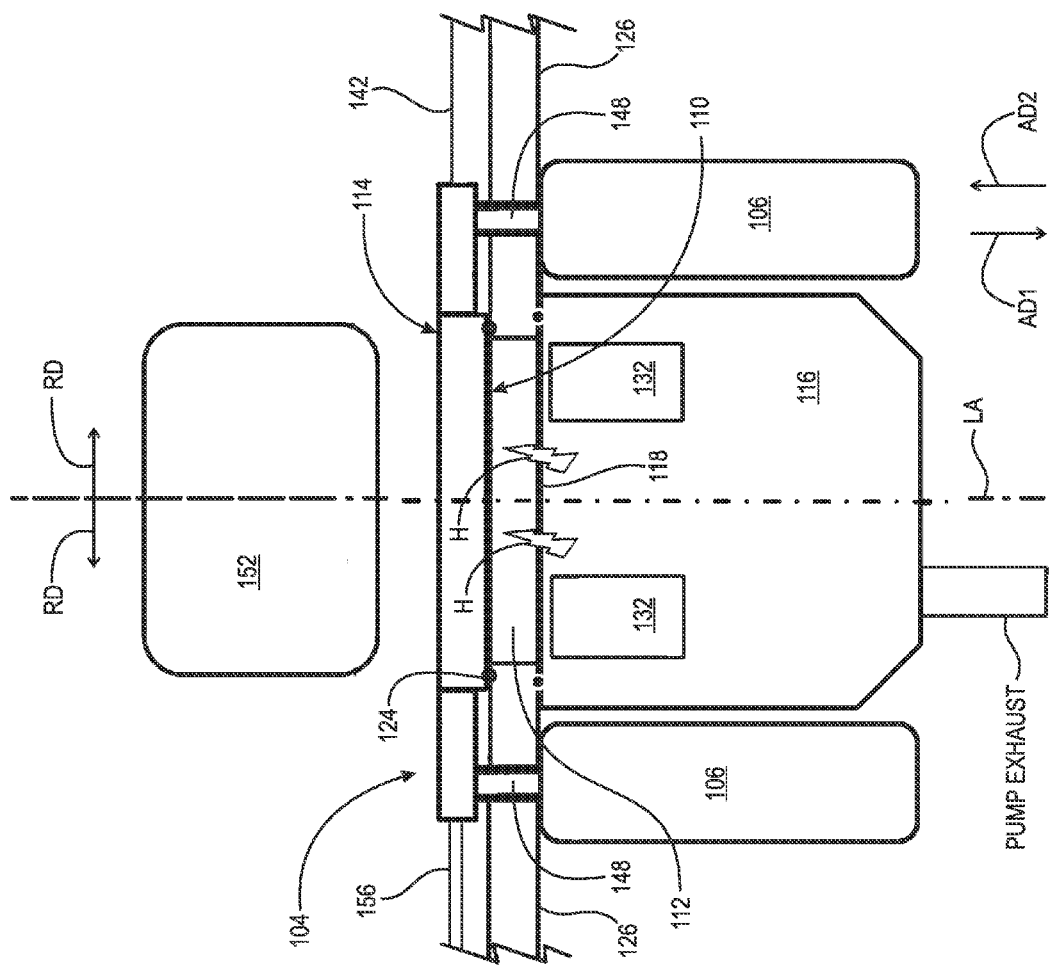
FIG. 4 is a schematic side view of the apparatus of FIG. 1 with the gate disc in a closed position.

FIG. 4 is a schematic side view of apparatus 100 of FIG. 1 with gate disc 104 in a closed position. The following should be viewed in light of FIGS. 1 through 4. In an example embodiment, gate disc 104 or chamber 108 includes seal 124 and the gate disc is displaceable in direction AD1 to engage the seal with wall 126 of the chamber and with surface 110 to seal the chamber from the opening, for example, sealing portion 110A of surface 110 radially inward of seal 124 from the chamber. Stated otherwise, engaging seal 124 with wall 126 seals the chamber from the inlet of the pump.

The vacuum pump is arranged to create flow 122 through the chamber, and at least a portion of outer circumference 120, for example, portions 120A, is located radially inward, with respect to axis LA of the flow. Stated otherwise: flow 122 is at radial distance 128, orthogonal to axis LA, from axis LA; the at least a portion of outer circumference 120 is at radial distance 130, orthogonal to axis LA, from axis LA; and distance 130 is less than distance 128. The radial location of flow 122 is typically due to the radial location of blades 132 for the vacuum pump. The relative radial locations of flow 122 and portions 120A are further discussed below.

In an example embodiment, the shield assembly includes thermal system 134 arranged to heat at least a portion of the gate disc, or cool at least a portion of the gate disc. In an example embodiment, system 134 both heats and cools respective portions of the gate disc. In an example embodiment, the thermal system is arranged to provide heat to one of: at least a portion of surface 110; or at least a portion of surface 114; and the thermal system is arranged to provide cooling to the other of the at least a portion of surface 110 or the at least a portion of the surface 114. Thermal control of disc 104 is further described below.

In an example embodiment, the gate disc includes sensor system 135 with at least one sensor 136 for measuring a physical parameter within the chamber. Sensor(s) 136 can be any sensor known in the art, measuring any parameter known in the art. In an example embodiment, the at least one sensor is embedded in disc 104. In an example embodiment, the at least one sensor 136 includes sensor 136T for measuring temperature within the chamber; or sensor 136 includes sensor 136P for measuring pressure within the chamber. In an example embodiment, the gate disc includes both sensor 136T and 136P. In the figures, sensors 136T and 136P are shown on each of surfaces 110 and 114; however, it should be understood that assembly 102 is not limited to a particular number or orientation of sensors 136. For example: sensors 136T and 136P can each be located only on side 110 or 114; the disc can include a single sensor 136T on one of sides 110 or 114; or the disc can include a single sensor 136P on one of sides 110 or 114.

In an example embodiment, shield assembly 102 includes thermal system 134 for controlling a temperature of the gate disc, and control system 138 including processor 140 configured to receive input 142 from sensor, or sensors, 136 regarding measurement 144 of the physical parameter; and, according to input 142: modify, using thermal system 134, the temperature of at least a portion of the gate disc; or displace, using the actuator, the gate disc in direction AD1 or AD2. Operation of systems 134 and 138 are further described below.

In an example embodiment, at least a portion of surface 110 includes layer 146 of getter material arranged to absorb impurities. Any getter material known in the art can be used.

In an example embodiment, thermal system 134 is used to cool surface 110 so that surface 110 acts as a cold plate trapping impurities in chamber 108, for example, impurities generated by operation of the vacuum pump.

The following provides further detail regarding the apparatus 100 and the operation of apparatus 100. In an example embodiment, the geometry and symmetry of the disc matches those of opening 112 and inlet 118. For example, opening 112 is circular and portions 120A are respective circular segments of circumference 120. In an example embodiment, actuator rods 148 are attached to disc 104, pass through wall 126, and are connected to actuator 106. Rods 148 are sealed with respect to wall 126 by any means known in the art. Then, the only portion of circumference 120 that does not mirror the symmetry of inlet 118, and which may intercept flow 122, is portion 120B of the circumference, to which rods 148 are attached. Note that 120B forms a relative small portion of circumference 120. Two rods 148 are shown in the figures; however, it should be understood that a different number and/or configuration of rods can be used. In an example embodiment, a separate actuator 106 is used for each rod 148.

As noted above, disc 104 is displaceable in direction AD1, toward the pump inlet, to seal the pump inlet for complete pumping isolation, and is displaceable in direction AD2, away from the pump inlet, to enable gas from the chamber to enter the vacuum pump.

In general, it is desirable, if not necessary, to attain and maintain a specified temperature in chamber 108, for example, to ensure proper operation and protection of optical and other components inside the chamber. Disc 104, in particular, surface 110, faces the pump interior components and shields chamber 108 from undesirable radiated heat H generated by such components. For example, blades 132 are typically made of a light-weight material, such as aluminum, which is a good heat conductor. The blades absorb heat from the pump and since the blades cannot be cooled, the blades radiate heat H toward the chamber. Heat H radiates in straight lines through the pump inlet, substantially parallel to axis LA or at an acute angle with respect to axis LA. Since surface 110 extends radially beyond opening 112, surface 110 intercepts the radiated heat. The radial extend of circumference 120 beyond opening 112 is configured to intercept the heat at the acute angle.

In addition, system 134 provides cooling to further offset undesirable heat generated by pump 116. For example, system 134 can be used to cool surface 110 to prevent heat absorbed/blocked by surface 110 from transmitting through disc 104 to chamber 108. Alternatively, system 134 can be used to cool surface 114 to prevent transmission of heat absorbed by surface 110.

When pump 116 is a cryogenic pump, surface 110 and system 134 can be used to prevent undesirable cooling of chamber 108. For example, system 134 can be used to heat surface 110 to counterbalance cooling of surface 110 by the pump operation. Alternatively, system 134 can be used to heat surface 114 to prevent transmission of cold absorbed by surface 110.

Sensor(s) 136 and control system 138 enable precise closed loop control of conditions in chamber 108. As noted above, it is desirable, if not necessary, to maintain a specified temperature in chamber 108. For example, sensor(s) 136T can be used to measure temperature in the chamber proximate surface 114 or proximate the pump inlet at surface 110. Processor 140 monitors measurement 144 and when the measurement deviates from a predetermined threshold value 150, processor 140 activates system 134 to provide heating or cooling as needed and where needed (surface 110, surface 114, or each of surfaces 110 and 114) to maintain the specified temperature.

In like manner, sensor(s) 136T can be used to attain a specified temperature, for example, at the beginning of a process when temperature in the chamber must be raised or lowered to the specified temperature. Advantageously, since sensor(s) 136T is located on side 110 and/or side 114, the sensor(s) does not interfere with flow 122.

In general, it is desirable, if not necessary, to attain and maintain a specified pressure and gas composition in chamber 108, for example, to ensure proper purging of the chamber and proper process gas pressure to ensure optimal operation and protection of optical and other components 152 inside the chamber. Sensor(s) 136P and control system 138 enable precise closed loop control of pressure in chamber 108. For example, sensor(s) 136P can be used to measure pressure in the chamber proximate surface 114 or proximate the pump inlet at surface 110. Processor 140 monitors measurement 144 and when the measurement deviates from a predetermined threshold value 152, processor 140 controls actuator 106 to: displace disc 104 in direction AD1 to increase pressure in the chamber; or displace disc 104 in direction AD2 to decrease pressure in the chamber.

In like manner, sensor(s) 136P can be used to attain a specified pressure, for example, at the beginning of a process when pressure in the chamber must be lowered to the specified pressure. Advantageously, since sensor(s) 136P is located on side 110 and/or side 114, the sensor(s) does not interfere with flow 122.

As an example, processor 140 controls the actuator to displace disc 104 fully in direction AD2 at the beginning of a process cycle, for example when a purge gas is being introduced into the chamber. It is desirable to maintain a high rate for flow 122 to complete the purge and remove contaminants from the chamber. Once pressure in the chamber has reached a specified level, the processor controls the actuator to displace disc 104 in direction AD1 to an equilibrium position (note that the displacement in direction AD1 can be gradual or abrupt as required). From the equilibrium position, relatively minor adjustments in directions AD1 or AD2 are made to maintain the desired pressure in the chamber while maintaining a fixed flow rate of process gas into the chamber and a fixed speed for the pump. This is particularly advantageous, as it is very desirable to avoid varying the gas flow rate since mechanisms for varying the flow rate typically cause undesirable vibration and noise, which is particularly problematic for optical components in the chamber. Further, changing the pump speed requires an undesirably long time for implementation.

Thus, apparatus 100 enables an efficient and rapid pump down of chamber 108 followed by precise control of pressure in the chamber. Further, the change in rate for flow 122 due to the displacement of disc 104 in direction AD1 and AD2 is linear, simplifying controls schemes.

It is particularly desirable to monitor temperature and pressure of the chamber proximate the pump inlet. For example, during the initial pump down of the chamber, it is important to correlate pump operation to the pump's pump curves (pressure versus flow, inlet pressure versus outlet pressure, and/or flow versus pump power) to accurately assess operation of the pump and ensure the pump operates with optimal efficiency within an acceptable range of operation for the pump. Known methods of measuring pressure in a chamber such as chamber 108 take pressure reading relatively far from the pump inlet, for example, on the wall of a chamber. Since pressure varies across the chamber during pump down, such reading do not accurately represent pressure at the inlet and hence do not enable accurate determination of a pump's operation with respect to pump curves. Advantageously, by locating sensor 136P on side 110, apparatus 100 enables accurate measurement of pressure proximate inlet 118, which in turn enables accurate correlation of the operation of pump 116 with respect to pump curves for pump 116.

As noted above, getter material 146 can be added to surface 110. Advantageously, apparatus 100 enables a process of regenerating the getter material while maintaining constant operation of pump 116 and a desired vacuum or low pressure environment in the chamber. For example, disc 104 is displaced in direction AD1 to seal the chamber with respect to opening 112 and inlet 118. Then, surface 110 is heated to regenerate material 146 and off-gas contaminants from the material. During this process, pump 116 continues to operate, pumping off the contaminants. Once sufficient regeneration has occurred, disc 104 is displaced in direction AD2 and process operations can be resumed. As a further advantage, system 134 can be used to cool surface 114 while surface 110 is being heated to prevent the introduction of heat into chamber 108.

Typically, a turbo-molecular pump 116 uses a magnetically-levitated blade rotor. It is very desirable to minimize energizing and de-energizing such pumps while simultaneously avoiding exposing the pump inlet to atmospheric pressure. De-energizing the pump causes the magnetic field for the rotor to collapse, which in turn causes the rotor to drop onto a stop bearing. Dropping the rotor onto the stop bearing creates wear on the rotor, generates particles, and reduces the useful life of the rotor and pump. Advantageously, apparatus 100 enables pump 116 to continue operating during virtually all operations, such as the regeneration process described above, while maintaining a vacuum seal for the pump.

In an example embodiment, surface 110 has a mirror finish, which reflects a portion of heat H back toward the pump, further reducing the transmission of heat to chamber 108 and/or reducing the cooling needed for disc 104. Typically, a flange or other parts for the pump are cooled and portions of the reflected heat are absorbed by the cooled flange or parts.

System 134 can use any heating or cooling means known in the art, including but not limited to fluid cooling and/or heating and electrical heating. In an example embodiment, lines 156 supple cooling/heating fluid and/or electrical power to disk 104.

The structure and functionality of apparatus 100 advantageously:

A. Provide thermal shielding for vacuum pumps (such as turbo-molecular and cryogenic pumps) without disturbing the flow and conductance of gas through a chamber to the pump.

B. Enable thermal shielding and controllable conductance gas-flow to the inlet of a vacuum pump without sacrificing or impairing pumping speed of the pump.

C. Enable control of ambient temperature at the pump inlet by removal or addition of heat flux.

D. Maintain equalized temperature profile within a process chamber by compensating for heat or cooling generated by a vacuum pump(s). That is, attain and maintain thermal uniformity in a vacuum process chamber.

E. Optimize pump performance and eliminate the need to add more pumps and control systems to compensate for the loss of conductance due to addition of a thermal shield.

F. Facilitate thermal control within a variable conductance valve in a vacuum system. Heat and/or cooling can be introduced where needed and as needed.

G. Enable local thermal uniformity and temperature control at the inlet of a vacuum pump.

H. Enable temperature and pressure measurement near the inlet of a pump.

I. Enable integration into the gate of a conductance control valve.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. An apparatus for shielding a controlled pressure environment, comprising:
   a shield assembly including:
      a gate disc arranged for location in a chamber and including a first continuous surface:
         facing an opening in the chamber; and,
         including an outer circumference extending past the opening in a radial direction orthogonal to a longitudinal axis passing through the chamber, a vacuum pump, and the opening; and,
      at least one actuator positioned adjacent to the vacuum pump in the radial direction and arranged to displace the gate disc in an axial direction parallel to the longitudinal axis, wherein:
   the opening is arranged for connection to an inlet of the vacuum pump.

2. The apparatus of claim 1 wherein:
the gate disc or the chamber includes a seal; and,
the gate disc is displaceable in the axial direction to engage the seal with a wall of the chamber and with the first continuous surface to seal the chamber from the opening.

3. The apparatus of claim 1, wherein:
the vacuum pump is arranged to create a flow through the chamber; and,
at least a portion of the outer circumference is located radially inward, with respect to the longitudinal axis, of the flow.

4. The apparatus of claim 3, wherein:
the flow is at a first distance, orthogonal to the longitudinal axis, from the longitudinal axis;
the at least a portion of the outer circumference is at a second radial distance, orthogonal to the longitudinal axis, from the longitudinal axis; and,
the second distance is less than the first distance.

5. The apparatus of claim 1, wherein the shield assembly includes a thermal system arranged to:
heat at least a portion of the gate disc; or,
cool at least a portion of the gate disc.

6. The apparatus of claim 5, wherein:
the gate disc includes a second surface facing away from the opening;
the thermal system is arranged to provide heat to one of at least a portion of the first continuous surface or at least a portion of the second surface; and,
the thermal system is arranged to provide cooling to an other of the at least a portion of the first continuous surface or the at least a portion of the second surface.

7. The apparatus of claim 1, wherein the gate disc includes a sensor for measuring a physical parameter within the chamber.

8. The apparatus of claim 7, wherein the sensor includes:
a sensor for measuring temperature within the chamber; or,
a sensor for measuring pressure within the chamber.

9. The apparatus of claim 1, wherein:
the gate disc includes a sensor for measuring a physical parameter within the chamber; and,
the shield assembly includes:
a thermal system for controlling temperature of the gate disc; and,
a control system including a processor configured to:
receive input from the sensor regarding a measurement of the physical parameter; and,
according to the input:
modify, using the thermal system, a temperature of at least a portion of the gate disc; or,
displace, using the at least one actuator, the gate disc.

10. The apparatus of claim 1, wherein at least a portion of the first continuous surface includes a layer of a getter material arranged to absorb impurities.

11. The apparatus of claim 1, wherein the at least one actuator is located outside of the chamber.

12. The apparatus of claim 1 wherein the longitudinal axis is centered within the opening.

13. An apparatus for shielding a controlled pressure environment, comprising:
a chamber with an opening and a longitudinal axis passing through the opening; and,
a shield assembly including:
a gate disc including a first continuous surface:
facing the opening; and,
including an outer circumference, an entirety of the outer circumference extending past the opening in a radial direction orthogonal to the longitudinal axis;
at least one actuator positioned adjacent to a vacuum pump in the radial direction and arranged to displace the gate disc in an axial direction parallel to the longitudinal axis; and,
a thermal system for controlling a temperature of at least a portion of the gate disc, wherein:
the longitudinal axis is centered within the opening, and passes through the chamber, the vacuum pump, and the opening;
the opening is arranged for connection to an inlet of the vacuum pump;
the vacuum pump is arranged to create a flow through the chamber; and,
at least a portion of the outer circumference is radially inward of the flow.

14. The apparatus of claim 13, wherein:
the flow is at a first radial distance, orthogonal to the longitudinal axis, from the longitudinal axis;
the at least a portion of the outer circumference is at a second radial distance, orthogonal to the longitudinal axis, from the longitudinal axis; and,
the second distance is less than the first distance.

15. The apparatus of claim 13, wherein:
the gate disc or the chamber includes a seal; and,
the gate disc is displaceable in the axial direction to engage the seal with a wall of the chamber and with the first continuous surface to seal at least a portion of the first continuous surface from the chamber.

16. The apparatus of claim 13, wherein:
the gate disc includes a sensor for measuring a temperature or pressure within the chamber; and,
the shield assembly includes:
a control system including a processor configured to:
receive input from the sensor system regarding a measurement of the temperature or the pressure; and,
according to the input:
modify, using the thermal system, a temperature of at least a portion of the gate disc; or,
displace, using the at least one actuator, the gate disc.

17. The apparatus of claim 13, wherein at least a portion of the first continuous surface includes a layer of a getter material arranged to absorb at least one impurity.

18. The apparatus for shielding a controlled pressure environment of claim 1, wherein the at least one actuator is fixedly secured to the outer circumference of the gate disc and arranged to displace the gate disc in the axial direction parallel to the longitudinal axis.

* * * * *